US006831292B2

(12) United States Patent
Currie et al.

(10) Patent No.: US 6,831,292 B2
(45) Date of Patent: Dec. 14, 2004

(54) SEMICONDUCTOR STRUCTURES EMPLOYING STRAINED MATERIAL LAYERS WITH DEFINED IMPURITY GRADIENTS AND METHODS FOR FABRICATING SAME

(75) Inventors: Matthew Currie, Windham, NH (US); Anthony Lochtefeld, Somerville, MA (US); Richard Hammond, Cambridge, MA (US); Eugene Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 124 days.

(21) Appl. No.: 10/251,424

(22) Filed: Sep. 20, 2002

(65) Prior Publication Data

US 2003/0057416 A1 Mar. 27, 2003

Related U.S. Application Data

(60) Provisional application No. 60/324,325, filed on Sep. 21, 2001.

(51) Int. Cl.[7] .............................................. H01L 29/06
(52) U.S. Cl. .......................................... 257/19; 257/18
(58) Field of Search ...................... 257/18, 19, E29.193

(56) References Cited

U.S. PATENT DOCUMENTS

| 5,283,456 A | 2/1994 | Hsieh et al. ................. 257/347 |
| 5,340,759 A | 8/1994 | Hsieh et al. ................... 437/41 |
| 5,461,250 A | 10/1995 | Burghartz et al. ........... 257/347 |
| 5,516,721 A | 5/1996 | Galli et al. ..................... 437/67 |
| 5,847,419 A | 12/1998 | Imai et al. ................... 257/192 |
| 5,891,769 A | 4/1999 | Liaw et al. .................. 438/167 |
| 6,051,482 A | 4/2000 | Yang ............................ 438/526 |
| 6,059,895 A | * 5/2000 | Chu et al. ................... 148/33.1 |
| 6,096,590 A | 8/2000 | Chan et al. .................. 438/233 |

(List continued on next page.)

FOREIGN PATENT DOCUMENTS

| DE | 100 11 054 A1 | 9/2000 |
| EP | 0 587 520 A1 | 3/1994 |
| EP | 0 889 502 A2 | 1/1999 |
| EP | 0 810 124 A2 | 4/1999 |
| EP | 0 910 124 A2 | 4/1999 |

OTHER PUBLICATIONS

IDS Reference C14, Ohguro et al., "Undoped Epitaxial Si Channel n–MOSFET Grown by UHV–CVD with Preheating", IEEE Trans. on Electron Devices 45, No. 3, Mar. 1998.*

Monroe, D. et al..; "Comparison of mobility–limiting mechanisms in high–mobility $Si_{1-x}Ge_x$ heterostructures," J. Vac. Sci. Technol. B 11(4), Jul./Aug. 1993, pp. 1731–1737.

Currie, M.T.; "SiGe Virtual Substrate Engineering for Integration of III–V Materials, Microelectromechanical Systems, and Strained Silicon MOSFET's with Silicon," Dept. of Materials Science and Engineering in Partial Fulfillment of the Requirements for the Degree of Doctor of Philosophy in Electronic Materials at the Massachusetts Institute of Technology, Feb. 2001, pp. 158–162, 170–18243.

(List continued on next page.)

Primary Examiner—Minhloan Tran
Assistant Examiner—Scott R. Wilson
(74) Attorney, Agent, or Firm—Testa, Hurwitz & Thibeault, LLP

(57) ABSTRACT

Semiconductor structures and devices including strained material layers having impurity-free zones, and methods for fabricating same. Certain regions of the strained material layers are kept free of impurities that can interdiffuse from adjacent portions of the semiconductor. When impurities are present in certain regions of the strained material layers, there is degradation in device performance. By employing semiconductor structures and devices (e.g., field effect transistors or "FETs") that have the features described, or are fabricated in accordance with the steps described, device operation is enhanced.

62 Claims, 4 Drawing Sheets

U.S. PATENT DOCUMENTS

| | | | |
|---|---|---|---|
| 6,111,267 A | 8/2000 | Fischer et al. | 257/19 |
| 6,180,978 B1 | 1/2001 | Chatterjee et al. | 257/327 |
| 6,350,993 B1 | 2/2002 | Chu et al. | 257/19 |
| 6,368,925 B2 | 4/2002 | Weon et al. | 438/289 |
| 6,368,946 B1 | 4/2002 | Dekker et al. | 438/488 |
| 6,380,013 B2 | 4/2002 | Lee | 438/184 |
| 6,429,061 B1 | 8/2002 | Rim | 438/198 |
| 6,455,377 B1 | 9/2002 | Zheng et al. | 438/268 |
| 6,482,714 B1 | 11/2002 | Hieda et al. | 438/416 |
| 6,483,156 B1 | 11/2002 | Adkisson et al. | 257/401 |
| 2002/0038898 A1 | 4/2002 | Sugiyama et al. | 257/378 |
| 2002/0109135 A1 | 8/2002 | Murota et al. | 257/20 |
| 2002/0113294 A1 | 8/2002 | Rhee et al. | 257/616 |
| 2002/0158311 A1 | 10/2002 | Ohnishi et al. | 257/591 |

OTHER PUBLICATIONS

Fitzgerald, E.A. et al.; "Relaxed $Ge_xSi_{1-x}$ structures for III–V integration with Si and high mobility two-dimensional electron gases in Si," Journal of Vacuum Science and Technology: Part B, American Institute of Physics; vol. 10, No. 4, Jul. 1, 1992, pp. 1807–1819.

Samavedam, S.B. et al.; "Novel dislocation structure and surface morphology effects in relaxed Ge/Si–Ge(graded)/Si structures," Journal of Applied Physics, American Institute of Physics; vol. 81, No. 7, Apr. 1, 1997, pp. 3108–3116.

Abiko et al., "A Channel Engineering Combined with Channel Epitaxy Optimization and TED Suppression for 0.15 $\mu$m n–n Gate CMOS Technology", 1995 Symposium on VLSI Technology Digest of Technical Papers, Apr. 1995, pp. 23–24.

Butler and Beaty, "MOS Fabrication Process Integrating Self–Aligned Polysilicon Gate and Post–Processed Metal Gate Devices on a Single Die", IEEE, Sep. 1991, pp. 199–203.

Chang et al., "SALVO Process for Sub–50 nm Low–$V_T$ Replacement Gate CMOS with KrF Lithography", IEDM, Apr. 2000, pp. 53–56.

Chatterjee et al., "CMOS Metal Replacement Gate Transistors using Tantalum Pentoxide Gate Insulator", IEDM, Sep. 1998, pp. 777–780.

Chatterjee et al., "Sub–100nm Gate Length Metal Gate NMOS Transistors Fabricated by a Replacement Gate Process", IEDM, Jul. 1997, pp. 821–824.

Hergenrother et al., "50nm Vertical Replacement–Gate (VRG) nMOSFETs with ALD $HfO_2$ and $Al_2O_3$ Gate Dielectrics", IEDM, Mar. 2001, pp. 51–54.

Hergenrother et al., "The Vertical Replacement–Gate (VRG) MOSFET: A 50nmVertical MOSFET with Lithography–Independent Gate Length", IEDM, Sep. 1999, pp. 75–78.

Lee et al., "Characteristics of TaN Gate MOSFET with Ultrathin Hafnium Oxide (8Å–12Å)", IEDM, Apr. 2000, pp. 39–42.

Leong et al., "A Self–Aligned Epitaxially Grown Channel MOSFET Device Architecture for Strained Si/SiGe Systems", Thin Solid Films, vol. 369, 2000, pp. 375–378.

Manchanda et al., "Si–Doped Aluminates for High Temperature Metal–Gate CMOS: Zr–Al–Si–O, A Novel Gate Dielectric for Low Power Applications", IEDM, Apr. 2000, p. 23–26.

Noda et al., "A 0.1—$\mu$m Delta–Doped MOSFET Fabricated with Post–Low–Energy Implanting Selective Epitaxy", IEEE Transactions on Electron Devices, vol. 45, No. 4, Apr. 1998, pp. 809–814.

Oh et al., "50 nm Vertical Replacement–Gate (VRG) pMOS-FETs", IEDM, Apr. 2000, pp. 65–68.

Ohguro et al., "An 0.18–$\mu$m CMOS for Mixed Digital and Analog Applications with Zero–Volt–$V_{th}$ Epitaxial–Channel MOSFET's", IEEE Transactions on Electron Devices, vol. 46, No. 7, Jul. 1999, pp. 1378–1383.

Ohguro et al., "Undoped Epitaxial Si Channel n–MOSFET Grown by UHV–CVD with Preheating", IEEE Transactions on Electron Devices, vol. 45, No. 3, Mar. 1998, pp. 710–716.

Ohguro et al., "0.15–$\mu$m Buried–Channel p–MOSFET's with Ultrathin Boron–Doped Epitaxial Si Layer", IEEE Transactions on Electron Devices, vol. 45, No. 3, Mar. 1998, pp. 717–721.

Vuong et al., "Design of 25–nm Salvo PMOS Devices", IEEE Electron Devices Letters, vol. 21, No. 5, May 2000, pp. 248–250.

Wong et al., "Fabrication of Ultrathin, Highly Uniform Thin–Film SOI Mosfet's with Low Series Resistance Using Pattern–Constrained Epitaxy", IEEE Transactions on Electron Devices, vol. 44, No. 7, Jul. 1997, pp. 1131–1135.

Yeo et al, "Nanoscale Ultra–Thin–Body–Silicon–on–Insulator P–MOSFET with a SiGe/Si Heterostructure Channel", IEEE Electron Device Letters, vol. 21, No. 4, Apr. 2000, pp. 161–163.

Yeo et al., "Enhanced Performance in Sub–100 nm CMOS-FETs using Strained Epitaxial Silicon–Germanium", IEDM, 2000, pp. 753–756.

Yeo et al., "Design and Fabrication of 50–nm Thin–Body p–MOSFETs with a SiGe Heterostructure Channel", IEEE Transactions on Electron Devices, vol. 49, No. 2, Feb. 2002, pp. 279–286.

* cited by examiner

SEMICONDUCTOR STRUCTURES EMPLOYING STRAINED MATERIAL LAYERS WITH DEFINED IMPURITY GRADIENTS AND METHODS FOR FABRICATING SAME

CROSS-REFERENCE TO RELATED APPLICATION

This application claims priority to and the benefit of, and incorporates herein by reference, in its entirety, provisional U.S. patent application Ser. No. 60/324,325, filed Sep. 21, 2001.

FIELD OF THE INVENTION

The present invention relates generally to semiconductor structures and devices and, more specifically, to semiconductor structures and field effect transistors (hereinafter, "FETs") incorporating strained material layers and controlled impurity diffusion gradients.

BACKGROUND OF THE INVENTION

"Virtual substrates" based on silicon (Si) and germanium (Ge) provide a platform for new generations of VLSI devices that exhibit enhanced performance when compared to devices fabricated on bulk Si substrates. The important component of a SiGe virtual substrate is a layer of SiGe that has been relaxed to its equilibrium lattice constant (i.e., one that is larger than that of Si). This relaxed SiGe layer can be directly applied to a Si substrate (e.g., by wafer bonding or direct epitaxy) or atop a relaxed graded SiGe layer, in which the lattice constant of the SiGe material has been increased gradually over the thickness of the layer. The SiGe virtual substrate can also incorporate buried insulating layers, in the manner of a silicon-on-insulator ("SOI") wafer. To fabricate high-performance devices on these platforms, thin strained layers of Si, Ge, or SiGe are grown on the relaxed SiGe virtual substrates. The resulting biaxial tensile or compressive strain alters the carrier mobilities in the layers, enabling the fabrication of high-speed devices, or low-power devices, or both.

A technique for fabricating strained Si wafers includes the following steps:
1. Providing a silicon substrate that has been edge polished;
2. Epitaxially depositing a relaxed graded SiGe buffer layer to a final Ge composition on the silicon substrate;
3. Epitaxially depositing a relaxed SiGe cap layer having a uniform composition on the graded SiGe buffer layer;
4. Planarizing the SiGe cap layer by, e.g., chemical mechanical polishing ("CMP");
5. Epitaxially depositing a relaxed SiGe regrowth layer having a uniform composition on the planarized surface of the SiGe cap layer; and
6. Epitaxially depositing a strained silicon layer on the SiGe regrowth layer.

The deposition of the relaxed graded SiGe buffer layer enables engineering of the lattice constant of the SiGe cap layer (and therefore the amount of strain in the strained silicon layer), while reducing the introduction of dislocations. The lattice constant of SiGe is larger than that of Si, and is a direct function of the amount of Ge in the SiGe alloy. Because the SiGe graded buffer layer is epitaxially deposited, it will initially be strained to match the in-plane lattice constant of the underlying silicon substrate. However, above a certain critical thickness, the SiGe graded buffer layer will relax to its inherently larger lattice constant.

The process of relaxation occurs through the formation of misfit dislocations at the interface between two lattice-mismatched layers, e.g., a Si substrate and a SiGe epitaxial layer (epilayer). Because dislocations cannot terminate inside a crystal, misfit dislocations have vertical dislocation segments at each end, i.e., threading dislocations, that may rise through the crystal to reach a top surface of the wafer. Both misfit and threading dislocations have stress fields associated with them. As explained by Eugene Fitzgerald et al., *Journal of Vacuum Science and Technology B*, Vol. 10, No. 4, 1992, incorporated herein by reference, the stress field associated with the network of misfit dislocations affects the localized epitaxial growth rate at the surface of the crystal. This variation in growth rates may result in a surface cross-hatch on lattice-mismatched, relaxed SiGe buffer layers grown on Si.

The stress field associated with misfit dislocations may also cause dislocation pile-ups under certain conditions. Dislocation pile-ups are a linear agglomeration of threading dislocations. Because pile-ups represent a high localized density of threading dislocations, they may render devices formed in that region unusable. Inhibiting the formation of dislocation pile-ups is, therefore, desirable.

Dislocation pile-ups are formed as follows. (See, e.g., Srikanth Samavedam et al., *Journal of Applied Physics*, Vol. 81, No. 7, 1997, incorporated herein by reference.) A high density of misfit dislocations in a particular region of a crystal will result in that region having a high localized stress field. This stress field may have two effects. First, the stress field may present a barrier to the motion of other threading dislocations attempting to glide past the misfits. This pinning or trapping of threading dislocations due to the high stress field of other misfit dislocations is known as work hardening. Second, the high stress field may strongly reduce the local epitaxial growth rate in that region, resulting in a deeper trough in the surface morphology in comparison to the rest of the surface cross-hatch. This deep trough may also pin threading dislocations attempting to glide past the region of high misfit dislocations. This cycle may perpetuate itself and result in a linear region with a high density of trapped threading dislocations, i.e., dislocation pile-up.

The term "MOS" (meaning "metal-oxide-semiconductor") is here used generally to refer to semiconductor devices, such as FETs, that include a conductive gate spaced at least by an insulting layer from a semiconducting channel layer. The terms "SiGe" and "$Si_{1-x}Ge_x$" are here used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

One challenge to the manufacturability of MOS devices with strained layers is that one or more high temperature processing steps are typically employed after the addition of the strained material. This can cause intermixing of the strained layer and underlying material. This intermixing is generally referred to as interdiffusion, and it can be described by well-known diffusion theory (e.g., Fick's laws). One example of interdiffusion is found in a FET where a strained layer is used as the channel. In this example, one or more impurities (e.g., dopants) are implanted after addition of the strained layer. If implantation is followed by a moderately high temperature step (e.g., a drive-in or anneal step), there can be rampant interdiffusion of the channel by the implant impurity due to the presence of implant damage and excess point defects in the strained layer. A result is that the impurity is present in the strained layer. Stated differently, the impurity profile (i.e., a gradient describing the impurity concentration as a function of location in the overall semiconductor or device) has a non-zero value in the strained layer. Presence of one or more impurities in the strained layer can, at certain concentrations, degrade overall device performance.

From the foregoing, it is apparent that there is still a need for a way to produce semiconductor structures and devices that include one or more strained layers that are not subject to the incursion of one or more impurity species during structure or device fabrication.

SUMMARY OF THE INVENTION

The present invention provides semiconductor structures and devices (e.g., FETs) that include one or more strained material layers that not only improve operational performance, but also are relatively free of interdiffused impurities. Consequently, the resulting semiconductor structures and devices do not exhibit the degraded performance that results from the presence of such impurities in the strained layers.

The invention features a semiconductor structure where at least one strained layer is disposed on a semiconductor substrate, forming an interface between the two. This structure is characterized by an impurity gradient that describes the concentration of one or more impurities (i.e., dopants) as a function of location in the structure. At the furthest part of the strained layer (i.e., a "distal zone" of the layer away from the interface), this impurity gradient has a value that is substantially equal to zero.

In one version of this embodiment, the invention provides a method for fabricating a semiconductor structure in a substrate. The method includes the step of disposing at least one strained layer on the substrate, forming an interface between the two. Performing at least one subsequent processing step on the substrate, after which the impurity gradient has a value substantially equal to zero in the distal zone, follows this. The subsequent processing step is generally performed within a predetermined temperature range, which affects the value of the impurity gradient, particularly in the distal zone.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the strained layer can include Si, Ge, SiGe, or any combination of these materials. At least about fifty Angstroms of the furthest part of the strained layer defines a distal zone where the impurity gradient has a value that is substantially equal to zero.

Various features of the invention are well suited to applications utilizing MOS transistors (e.g., FETs) that include, for example, one or more of Si, $Si_{1-x}Ge_x$ or Ge layers in or on a substrate.

In another embodiment, the invention includes a FET fabricated in a semiconductor substrate. The FET has a channel region that includes at least one strained channel layer. The strained channel layer has a distal zone away from the substrate. The impurity gradient that characterizes the substrate and the channel region has a value substantially equal to zero in the distal zone.

In one version of this embodiment, the invention provides a method for fabricating a FET in a semiconductor substrate. The method includes the step of disposing at least one strained channel layer in at least the channel region of the FET. (The strained channel layer has a distal zone away from the substrate.) Performing at least one subsequent processing step on the substrate, after which the impurity gradient has a value substantially equal to zero in the distal zone, follows this. The subsequent processing step is generally performed within a predetermined temperature range, which affects the value of the impurity gradient, particularly in the distal zone.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

Figure 1:
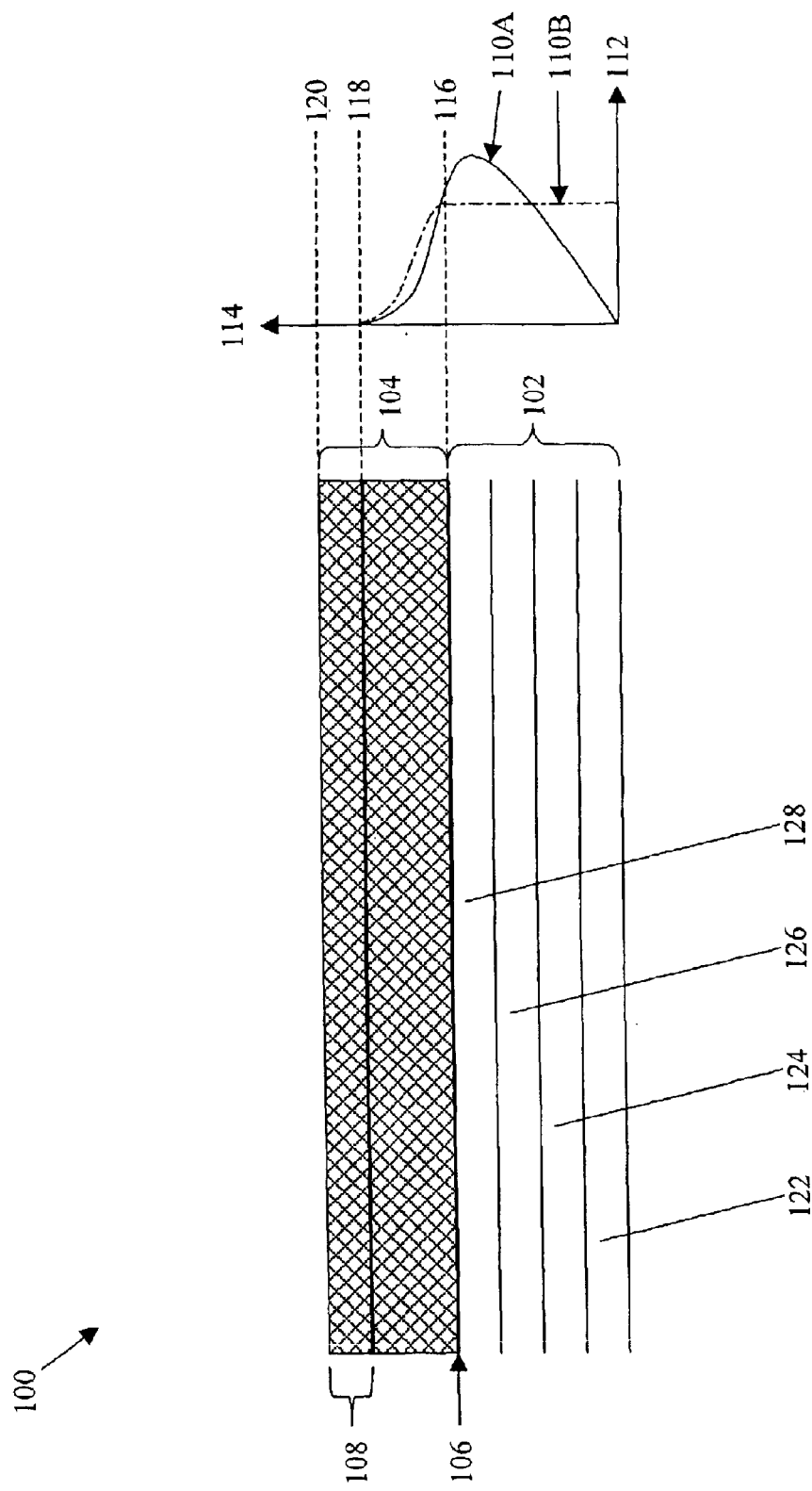
FIG. 1 is a schematic (unscaled) cross-sectional view that depicts a semiconductor structure in accordance with an embodiment of the invention.

As shown in the drawings for the purposes of illustration, the invention may be embodied in a semiconductor structure or device, such as, for example, a FET, with specific structural features. A semiconductor structure or FET according to the invention includes one or more strained material layers that are relatively free of interdiffused impurities. These strained material layers are characterized by at least one diffusion impurity gradient that has a value that is substantially equal to zero in a particular area of the strained layer. Consequently, the semiconductor structure or FET does not exhibit the degraded performance that results from the presence of such impurities in certain parts of the strained layers.

In brief overview, FIG. 1 depicts a schematic (unsealed) cross-sectional view of a semiconductor structure 100 in accordance with an embodiment of the invention. The semiconductor structure 100 includes a substrate 102. The substrate 102 may be Si, SiGe, or other compounds such as, for example, GaAs or InP. The substrate 102 may also include multiple layers 122, 124, 126, 128, typically of different materials. (Although FIG. 1 depicts four layers 122, 124, 126, 128, this is for illustration only. A single, two, or more layers are all within the scope of the invention.)

In one embodiment, the multiple layers 122, 124, 126, 128 include relaxed SiGe disposed on compositionally graded SiGe. In another embodiment, the multiple layers 122, 124, 126, 128 include relaxed SiGe disposed on Si. One or more of the multiple layers 122, 124, 126, 128 may also include a buried insulating layer, such as $SiO_2$ or $Si_3N_4$. The buried insulating layer may also be doped.

In another embodiment, a relaxed, compositionally graded SiGe layer 124 is disposed on a Si layer 122 (typically part of an Si wafer that may be edge polished), using any conventional deposition method (e.g., chemical vapor deposition ("CVD") or molecular beam epitaxy ("MBE")), and the method may be plasma-assisted. A further relaxed SiGe layer 126, but having a uniform composition, is disposed on the relaxed, compositionally graded SiGe layer 124. The relaxed, uniform SiGe layer 126 is then planarized, typically by CMP. A relaxed SiGe regrowth layer 128 is then disposed on the relaxed, uniform SiGe layer 126.

One or more strained layers 104 are disposed on the substrate 102. Between the substrate 102 and the strained layer 104 is an interface 106. Located away from the interface 106 is the distal zone 108 of the strained layer 104.

In various embodiments, the strained layer 104 includes one or more layers of Si, Ge, or SiGe. The "strain" in the strained layer 104 may be compressive or tensile, and it may be induced by lattice mismatch with respect to an adjacent layer, as described above, or mechanically. For example, strain may be induced by the deposition of overlayers, such as $Si_3N_4$. Another way is to create underlying voids by, for example, implantation of one or more gases followed by annealing. Both of these approaches induce strain in the underlying substrate 102, in turn causing strain in the strained layer 104.

The substrate 102, strained layer 104, and interface 106 are characterized, at least in part, by an impurity gradient 110A, 110B (collectively, 110). The impurity gradient 110 describes the concentration of the impurity species as a function of location across the substrate 102, strained layer 104, and interface 106. The impurity gradient 110 may be determined by solving Fick's differential equations, which describe the transport of matter:

$$J = -D\frac{\partial N}{\partial x} \quad \text{(Equation 1)}$$

$$\frac{\partial N}{\partial t} = D\frac{\partial^2 N}{\partial x^2} \quad \text{(Equation 2)}$$

In equations (1) and (2), "J" is the impurity flux, "D" is the diffusion coefficient, and "N" is the impurity concentration. Equation (1) describes the rate of the permeation of the diffusing species through unit cross sectional area of the medium under conditions of steady state flow. Equation (2) specifies the rate of accumulation of the diffusing species at different points in the medium as a function of time, and applies to transient processes. In the general case, equations (1) and (2) are vector-tensor relationships that describe these phenomena in three dimensions. In some cases, equations (1) and (2) may be simplified to one dimension.

The steady state solution to equation (1), which is not detailed herein, is a function of the Gaussian error function:

$$\text{erf}(y) = \frac{2}{\sqrt{\pi}} \int_0^y e^{-z^2} dz \quad \text{(Equation 3)}$$

An example solution is shown in FIG. 1 as the impurity gradient 110. Axis 112 represents the impurity concentration, typically in units of $cm^{-3}$. Axis 114 corresponds to the location in the semiconductor structure 100. Axis 114 is aligned with the semiconductor structure 100 to illustrate a typical impurity profile, meaning that the impurity concentration at any point in the semiconductor structure 100 can be ascertained as a function of location. Except as described below, the depicted shape of the impurity gradient 110 is not intended to be limiting. For example, impurity gradient 110A may describe a profile of a p-type (e.g., boron) or n-type (e.g., phosphorous or arsenic) dopant introduced in the substrate 102. On the other hand, impurity gradient 110B may, for example, describe a substantially constant concentration of Ge, or Si, or both, in the substrate 102 that takes on a desired value (e.g., a reduced value) in the strained layer 104. Stated differently, the impurity gradient 110 may describe the concentration of any species in the substrate 102, including the substrate species itself, at any point in the semiconductor structure 100.

Boundary 116 represents the interface between the substrate 102 and the strained layer 104. Boundary 118 depicts the start of the distal zone 108 of the strained layer 104. Boundary 120 corresponds to the edge of the strained layer 104. Of note are the locations where the boundaries 116, 118, 120 intersect the axis 114 and the impurity gradient 110. In particular, the impurity gradient 110 has a value substantially equal to zero in the distal zone 108. This is depicted by the impurity gradient 110 approaching the axis 114 at boundary 118, and remaining there, or at zero, or at another value substantially equal to zero, between boundary 118 and 120. Of course, the impurity gradient 110 can also have a value substantially equal to zero before reaching the boundary 118. In any case, one embodiment of the invention features a distal zone 108 that includes at least about fifty Angstroms of the furthest part of the strained layer 104. That is, the distal zone 108 is at least about fifty Angstroms thick.

Figure 2:
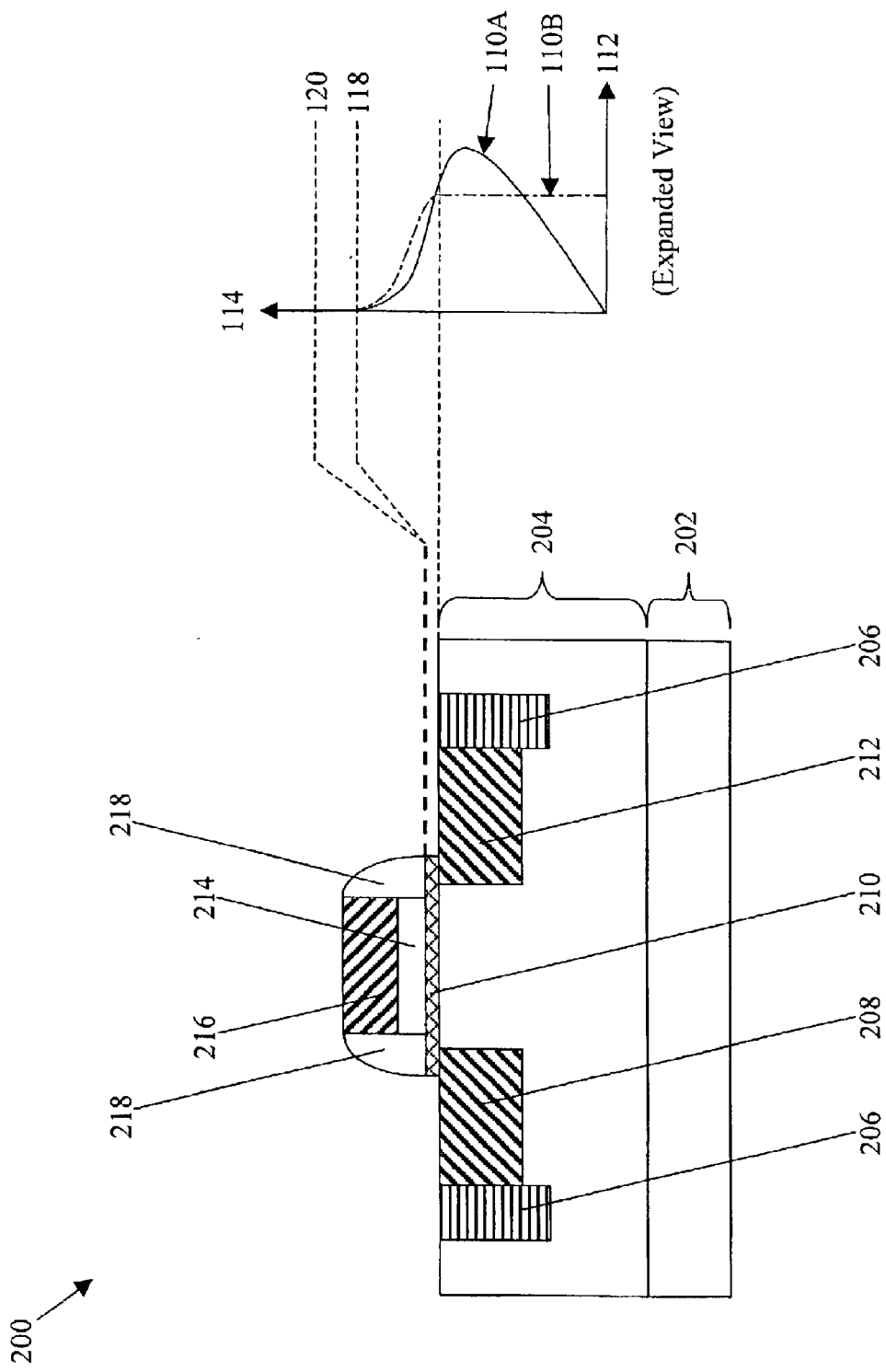
FIG. 2 is a schematic (unsealed) cross-sectional view that depicts a FET in accordance with an embodiment of the invention.

In another embodiment depicted schematically (i.e., unsealed) in FIG. 2, a FET 200 is fabricated in a similar semiconductor structure. The FET 200 includes a semiconductor substrate 202, which may be Si, SiGe, or other compounds such as, for example, GaAs or InP. The substrate 202 can be multi-layered, and it can include relaxed SiGe disposed on compositionally graded SiGe, or relaxed SiGe disposed on Si. The substrate 202 may also include a buried insulating layer, such as $SiO_2$ or $Si_3N_4$. The buried insulating layer may also be doped.

Disposed on the substrate 202 is an isolation well 204, typically including an oxide. Within the isolation well 204 are isolation trenches 206. A source region 208 and a drain region 212 are typically formed by ion implantation. A FET channel 210 is formed from one or more strained layers. The strained layers can include one or more layers of Si, Ge, or SiGe. The "strain" in the strained layers may be compressive or tensile, and it may be induced as described above. The furthest part of the channel 210 is located away from the substrate 202. This furthest part forms the distal zone of the channel 210.

Disposed on at least part of the channel 210 is a gate dielectric 214, such as, for example, $SiO_2$, $Si_3N_4$, or any other material with a dielectric constant greater than that of $SiO_2$ (e.g., $HfO_2$, HfSiON). The gate dielectric 214 is typically twelve to one hundred Angstroms thick, and it can include a stacked structure (e.g., thin $SiO_2$ capped with another material having a high dielectric constant).

Disposed on the gate dielectric 214 is the gate electrode 216. The gate electrode 216 material can include doped or undoped polysilicon, doped or undoped poly-SiGe, or metal. Disposed about the gate electrode 216 are the transistor spacers 218. The transistor spacers 218 are typically formed by depositing a dielectric material, which may be the same material as the gate dielectric 214, followed by anisotropic etching.

The impurity gradient 110 also characterizes the channel 210 and the substrate 202, as well as the isolation well 204. This is shown in FIG. 2 in an expanded view that, for clarity, differs in scale compared to the remainder of (unscaled) FIG. 2. The distal zone of the channel 210 corresponds to that portion of the impurity gradient 110 between boundaries 118, 120 (expanded for clarity). Within the distal zone of the channel 210, the impurity gradient 110 has a value substantially equal to zero. As discussed above, the depicted shape of the impurity gradient 110 is not intended to be limiting, and the impurity gradient 110 can also have a value substantially equal to zero before reaching the boundary 118. One embodiment of the invention features a distal zone 108 that includes at least about fifty Angstroms of the furthest part of the channel 210. That is, the distal zone is at least about fifty Angstroms thick.

One version of an embodiment of the invention provides a method for fabricating a FET in a semiconductor substrate. The method includes the step of disposing one or more strained channel layers in the FET channel region. The channel layer has a distal zone away from the substrate. The distal zone includes at least about fifty Angstroms of the furthest part of the channel region. An impurity gradient characterizes at least the substrate and the strained layers.

Next, one or more subsequent processing steps are performed on the substrate. After these subsequent processing steps are performed, the impurity gradient has a value that is substantially equal to zero in the distal zone. Since the impurity gradient can be influenced by temperature, the subsequent processing steps are typically performed within a predetermined temperature range that is chosen to ensure that the impurity gradient has a desired value, particularly in the distal zone.

Figure 3:
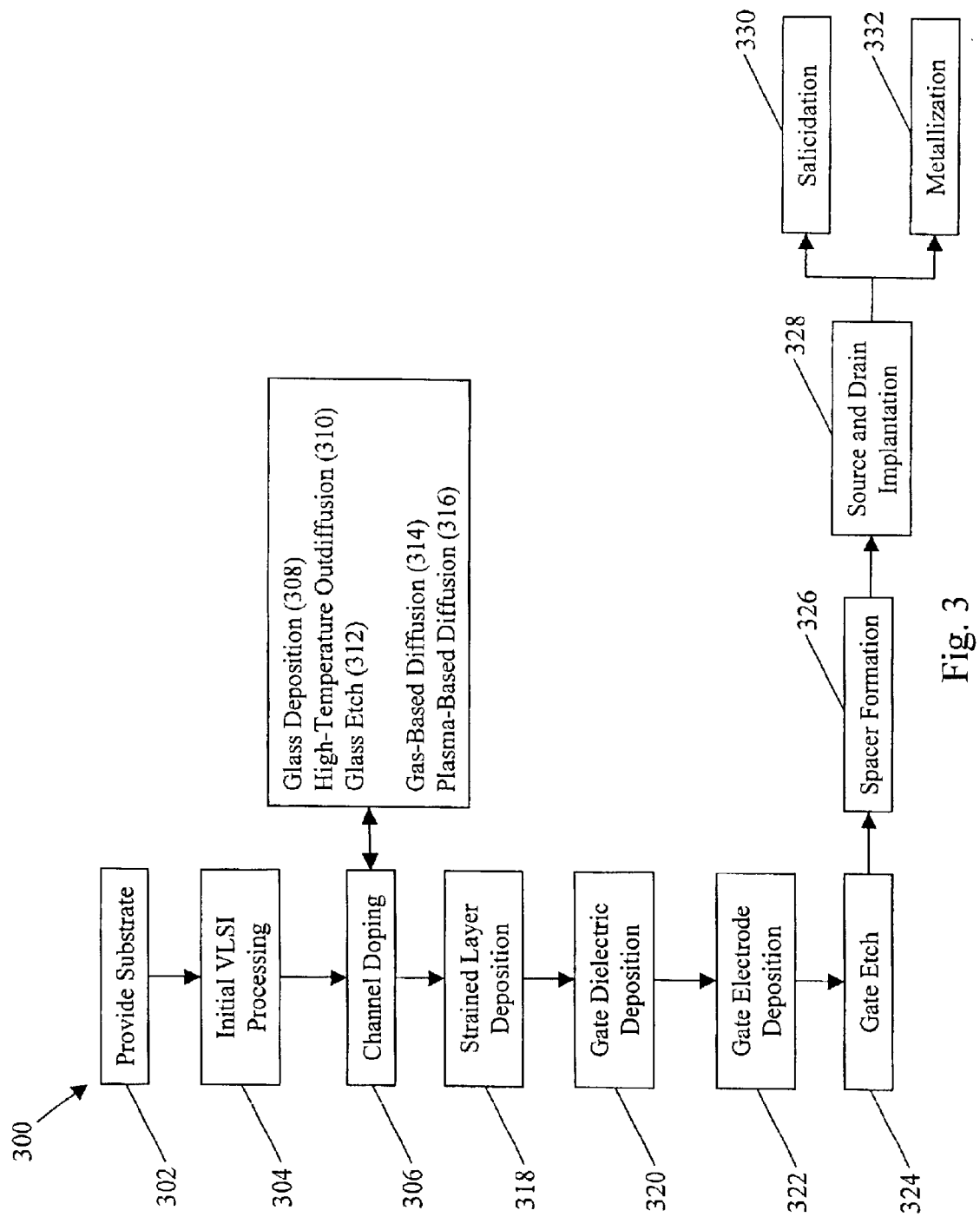
FIG. 3 is a flowchart depicting the steps of fabricating a FET in accordance with an embodiment of the invention.

FIG. 3 depicts a method 300 for fabricating the FET in accordance with an embodiment of the invention. This method includes the step of providing a substrate, typically planarized, and without strained layers (step 302). The substrate can include relaxed SiGe on a compositionally graded SiGe layer, relaxed SiGe on a Si substrate, relaxed SiGe on Si, or other compounds such as GaAs or InP. The substrate can also contain a buried insulating layer.

Next, initial VLSI processing steps are performed such as, for example, surface cleaning, sacrificial oxidation, deep well drive-in, and isolation processes like shallow trench isolation with liner oxidation or LOCOS (step 304). Any number of these steps may include high temperatures or surface material consumption. Features defined during step 304 can include deep isolation wells and trench etch-refill isolation structures. Typically, these isolation trenches will be refilled with $SiO_2$ or another insulating material, examples of which are described above.

Next, the channel region is doped by techniques such as shallow ion implantation or outdiffusion from a solid source (step 306). For example, a dopant source from glass such as BSG or PSG may be deposited (step 308), followed by a high temperature step to outdiffuse dopants from the glass (step 310). The glass can then be etched away, leaving a sharp dopant spike in the near-surface region of the wafer (step 312). This dopant spike may be used to prevent short-channel effects in deeply scaled surface channel FETs, or as a supply layer for a buried channel FET that would typically operate in depletion mode. The subsequently deposited channel layers can then be undoped, leading to less mobility-limiting scattering in the channel of the device and improving its performance. Likewise, this shallow doping may be accomplished via diffusion from a gas source (e.g., rapid vapor phase doping or gas immersion laser doping) (step 314) or from a plasma source as in plasma immersion ion implantation doping (step 316).

Next, deposit one or more strained channel layers, preferably by a CVD process (step 318). The channel may be Si, Ge, SiGe, or a combination of multiple layers of Si, Ge, or SiGe. Above the device isolation trenches or regions, the deposited channel material typically will be polycrystalline. Alternatively, the device channels may be deposited selectively, i.e., only in the device active area and not on top of the isolation regions. Typically, the remaining steps in the transistor fabrication sequence will involve lower thermal budgets and little or no surface material consumption.

Next, the transistor fabrication sequence is continued with the growth or deposition of a gate dielectric (step 320) and the deposition of a gate electrode material (step 322). Examples of gate electrode material include doped or undoped polysilicon, doped or undoped poly-SiGe, or metal. This material stack is then etched (step 324), forming the gate of the transistor. Typically, this etch removes the gate electrode material by a process such as reactive ion etching ("RIE") and stops on the gate dielectric, which is then generally removed by wet etching. After this, the deposited channel material typically is still present.

Next, the transistor spacers are formed by the traditional process of dielectric material deposition and anisotropic etching (step 326). Step 326 may be preceded by extension implantation, or removal of the channel material in the regions not below the gate, or both. If the channel material is not removed before spacer material deposition, the spacer etch may be tailored to remove the excess channel material in the regions not below the gate. Failure to remove the excess channel material above the isolation regions can result in device leakage paths.

Next, the source and drain regions are fabricated, typically by ion implantation (step 328). Further steps to complete the device fabrication can include salicidation (step 330) and metallization (step 332).

Figure 4:
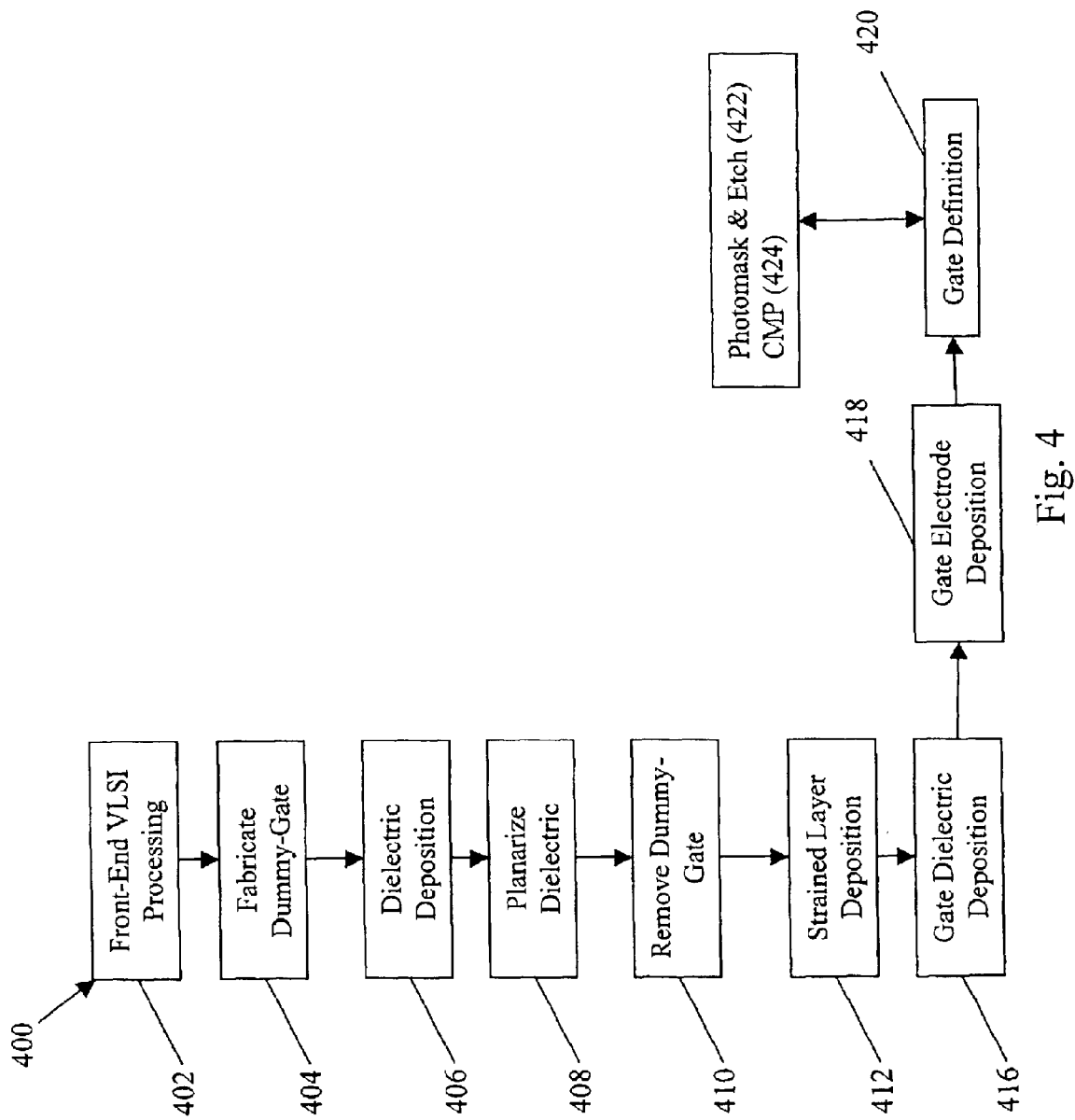
FIG. 4 is a flowchart depicting the steps of fabricating a FET in accordance with another embodiment of the invention.

FIG. 4 depicts another method 400 for fabricating the FET in accordance with an embodiment of the invention. This method includes creating the channel at a different point in the fabrication process, and starts with performing the traditional front-end VLSI processing steps, such as, for example, well formation, isolation, gate stack deposition and definition, spacer formation, source-drain implant, silicidation (step 402). In place of a gate electrode, fabricate a "dummy gate" (step 404). This dummy gate is etched and replaced in subsequent processing steps. The dummy gate may include an insulating material such as $Si_3N_4$ (or any of the other dielectric materials discussed), or a conducting material such as polysilicon, poly-Ge, or metal. In contrast to a typical MOSFET process where the gate is separated from the semiconductor substrate by a gate dielectric, the dummy gate is separated from the substrate by an etch-stop layer. The etch-stop layer can be of $SiO_2$, either thermally grown or deposited.

Next, a dielectric layer is deposited (e.g., by a CVD process) (step 406) and planarized (step 408) by, for example, CMP. This "planarization layer" is typically a different material then the dummy gate.

Next, the dummy gate is removed by a selective etching process (step 410). The etch-stop layer protects the substrate from this etching process. A wet or dry etch then removes the etch-stop layer.

An example configuration includes a polysilicon dummy gate, an $SiO_2$ etch-stop layer, $Si_3N_4$ spacers, and an $SiO_2$ planarization layer. This configuration allows selective removal of the dummy gate with an etchant such as heated tetramethylammonium hydroxide ("TMAH"), thereby leaving the $SiO_2$ and $Si_3N_4$ intact. The etch-stop is subsequently removed by a wet or dry etch (e.g., by HF).

Next, one or more strained channel layers is deposited, typically by a CVD process (step 412). The channel layers may be Si, Ge, SiGe, or a combination of multiple layers of Si, Ge, or SiGe. The gate dielectric is then thermally grown or deposited (by CVD or sputtering, for example) (step 416). This is followed by deposition of the gate electrode material (step 418), which can include doped or undoped polysilicon, doped or undoped poly-SiGe, or metal.

Next, the gate electrode is defined (step 420). This can be by photomasking and etching (step 422) of the gate electrode material. This may also be done by a CMP step (step 424), where the gate electrode material above the planarization layer is removed.

Using this method, a silicide is generally formed on the source and drain regions before the deposition of the planarization layer. In this case, all subsequent processing steps are typically limited to a temperature that the silicide can withstand without degradation. One alternative is to form the silicide at the end of the process. In this case, the planarization layer may be removed by a selective wet or dry etch which leaves the gate electrode material and the spacers intact. This is followed by a traditional silicide process, e.g., metal deposition and thermally activated silicide formation on the source and drain regions (and also on the gate electrode material, if the latter is polysilicon), followed by a wet etch strip of unreacted metal. Further steps to complete the device fabrication can include inter-layer dielectric deposition and metallization. Note that if the step of forming the gate dielectric is omitted, a metal gate electrode may be deposited directly on the channel, resulting in the fabrication of a self-aligned HEMT (or MESFET) structure.

From the foregoing, it will be appreciated that the semiconductor structures and devices provided by the invention afford a simple and effective way to minimize or eliminate the impurities in certain parts of strained material layers used therein. The problem of degraded device performance that results from the presence of such impurities is largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes which come within the meaning and range of equivalency of the claims are therefore intended to be embraced therein.

What is claimed is:

1. A semiconductor structure comprising:
   a substrate; and
   at least one strained layer disposed on the substrate, thereby defining an interface therebetween, the at least one strained layer having a distal zone away from the interface;
   wherein the substrate, the interface, and the at least one strained layer are characterized at least in part by an impurity gradient having a value substantially equal to zero in the distal zone.

2. The semiconductor structure of claim 1 wherein the substrate comprises Si.

3. The semiconductor structure of claim 1 wherein the substrate comprises SiGe.

4. The semiconductor structure of claim 1 wherein the substrate comprises a p-type dopant.

5. The semiconductor structure of claim 1 wherein the substrate comprises an n-type dopant.

6. The semiconductor structure of claim 1 wherein the substrate comprises a plurality of layers.

7. The semiconductor structure of claim 6 wherein the plurality of layers comprises relaxed SiGe disposed on compositionally graded SiGe.

8. The semiconductor structure of claim 6 wherein the plurality of layers comprises relaxed SiGe disposed on Si.

9. The semiconductor structure of claim 6 wherein the plurality of layers comprises a buried insulating layer.

10. The semiconductor structure of claim 1 wherein the at least one strained layer comprises Si.

11. The semiconductor structure of claim 1 wherein the at least one strained layer comprises Ge.

12. The semiconductor structure of claim 1 wherein the at least one strained layer comprises SiGe.

13. The semiconductor structure of claim 1 wherein the distal zone comprises at least about fifty Angstroms of the at least one strained layer.

14. The semiconductor structure of claim 10 wherein the impurity gradient describes at least the concentration of Ge.

15. The semiconductor structure of claim 11 wherein the impurity gradient describes at least the concentration of Si.

16. A FET fabricated in a semiconductor substrate, the FET comprising a channel region including at least one strained channel layer, the at least one strained channel layer having a distal zone away from the substrate, wherein the substrate and the channel region are characterized at least in part by an impurity gradient having a value substantially equal to zero in the distal zone.

17. The FET of claim 16 wherein the substrate comprises Si.

18. The FET of claim 16 wherein the substrate comprises SiGe.

19. The FET of claim 16 wherein the substrate comprises a p-type dopant.

20. The FET of claim 16 wherein the substrate comprises an n-type dopant.

21. The FET of claim 16 wherein the substrate comprises a plurality of layers.

22. The FET of claim 21 wherein the plurality of layers comprises relaxed SiGe disposed on compositionally graded SiGe.

23. The FET of claim 21 wherein the plurality of layers comprises relaxed SiGe disposed on Si.

24. The FET of claim 21 wherein the plurality of layers comprises a buried insulating layer.

25. The FET of claim 16 wherein the at least one strained channel layer comprises Si.

26. The FET of claim 16 wherein the at least one strained channel layer comprises Ge.

27. The FET of claim 16 wherein the at least one strained channel layer comprises SiGe.

28. The FET of claim 16 wherein the distal zone comprises at least about fifty Angstroms of the at least one strained channel layer.

29. The FET of claim 25 wherein the impurity gradient describes at least the concentration of Ge.

30. The FET of claim 26 wherein the impurity gradient describes at least the concentration of Si.

31. A method for fabricating a semiconductor structure in a substrate, the method comprising the steps of:

disposing at least one strained layer on the substrate thereby defining an interface therebetween, the at least one strained layer having a distal zone away from the interface; and performing at least one subsequent processing step on the substrate after which an impurity gradient characterizing, at least in part, the substrate, the interface, and the at least one strained layer has a value substantially equal to zero in the distal zone.

32. The method of claim 31 wherein the substrate comprises Si.

33. The method of claim 31 wherein the substrate comprises SiGe.

34. The method of claim 31 wherein the substrate comprises a p-type dopant.

35. The method of claim 31 wherein the substrate comprises an n-type dopant.

36. The method of claim 31 wherein the substrate comprises a plurality of layers.

37. The method of claim 36 wherein the plurality of layers comprises relaxed SiGe disposed on compositionally graded SiGe.

38. The method of claim 36 wherein the plurality of layers comprises relaxed SiGe disposed on Si.

39. The method of claim 36 wherein the plurality of layers comprises a buried insulating layer.

40. The method of claim 31 wherein the at least one strained layer comprises Si.

41. The method of claim 31 wherein the at least one strained layer comprises Ge.

42. The method of claim 31 wherein the at least one strained layer comprises SiGe.

43. The method of claim 31 wherein the distal zone comprises at least about fifty Angstroms of the at least one strained layer.

44. The method of claim 31 wherein the at least one subsequent processing step is performed within a predetermined temperature range.

45. The method of claim 40 wherein the impurity gradient describes at least the concentration of Ge.

46. The method of claim 41 wherein the impurity gradient describes at least the concentration of Si.

47. A method for fabricating a FET in a semiconductor substrate, the FET comprising a channel region, the method comprising the steps of:

disposing at least one strained channel layer in at least the channel region, the at least one strained channel layer having a distal zone away from the substrate; and performing at least one subsequent processing step on the substrate after which an impurity gradient characterizing, at least in part, the substrate and the at least one strained layer has a value substantially equal to zero in the distal zone.

48. The method of claim 47 wherein the substrate comprises Si.

49. The method of claim 47 wherein the substrate comprises SiGe.

50. The method of claim 47 wherein the substrate comprises a p-type dopant.

51. The method of claim 47 wherein the substrate comprises an p-type dopant.

52. The method of claim 47 wherein the substrate comprises a plurality of layers.

53. The method of claim 52 wherein the plurality of layers comprises relaxed SiGe disposed on compositionally graded SiGe.

54. The method of claim 52 wherein the plurality of layers comprises relaxed SiGe disposed on Si.

55. The method of claim 52 wherein the plurality of layers comprises a buried insulating layer.

56. The method of claim 47 wherein the at least one strained layer comprises Si.

57. The method of claim 47 wherein the at least one strained layer comprises Ge.

58. The method of claim 47 wherein the at least one strained layer comprises SiGe.

59. The method of claim 47 wherein the distal zone comprises at least about fifty Angstroms of the at least one strained layer.

60. The method of claim 47 wherein the at least one subsequent processing step is performed within a predetermined temperature range.

61. The method of claim 56 wherein the impurity gradient describes at least the concentration of Ge.

62. The method of claim 57 wherein the impurity gradient describes at least the concentration of Si.

* * * * *

UNITED STATES PATENT AND TRADEMARK OFFICE
CERTIFICATE OF CORRECTION

PATENT NO. : 6,831,292 B2
DATED : December 14, 2004
INVENTOR(S) : Currie et al.

It is certified that error appears in the above-identified patent and that said Letters Patent is hereby corrected as shown below:

Column 12,
Line 24, claim 51 should read as follows:
-- 51. The method of claim 47 wherein the substrate comprises an n-type dopant. --

Signed and Sealed this

Fifth Day of April, 2005

JON W. DUDAS
*Director of the United States Patent and Trademark Office*